US008318401B2

(12) United States Patent
Kang et al.

(10) Patent No.: US 8,318,401 B2
(45) Date of Patent: Nov. 27, 2012

(54) POSITIVE TYPED PHOTOSENSITIVE COMPOSITION

(75) Inventors: Seok Chan Kang, Daegu (KR); Jin Han Lee, Incheon (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 266 days.

(21) Appl. No.: 12/869,002

(22) Filed: Aug. 26, 2010

(65) Prior Publication Data
US 2011/0183115 A1    Jul. 28, 2011

(30) Foreign Application Priority Data
Jan. 22, 2010    (KR) .................. 10-2010-0005910

(51) Int. Cl.
*G03F 7/023* (2006.01)
*G03F 7/30* (2006.01)

(52) U.S. Cl. ........ 430/191; 430/192; 430/193; 430/326; 430/330; 430/906

(58) Field of Classification Search .................. 430/191, 430/192, 193
See application file for complete search history.

(56) References Cited

U.S. PATENT DOCUMENTS
6,933,087 B2 *   8/2005   Suwa et al. .................. 430/7
2005/0202337 A1 *   9/2005   Miyoshi et al. ............ 430/270.1
2008/0206548 A1 *   8/2008   Enoki et al. ................ 428/319.3
* cited by examiner Primary Examiner — John Chu
(74) Attorney, Agent, or Firm — Ladas & Parry LLP

(57) ABSTRACT

Disclosed is a photosensitive resin composition, comprising 0.1 to 20 parts by weight of a polygonal oligomeric silsesquioxane derivative, and 5 to 30 parts by weight of a compound generating acid by light, based on 100 parts by weight of a polyamide derivative.

9 Claims, No Drawings

POSITIVE TYPED PHOTOSENSITIVE COMPOSITION

CROSS-REFERENCE TO RELATED APPLICATION

This application claims priority to Korean Patent Application No. 10-2010-0005910 entitled "Positive Typed Photosensitive Composition" filed on Jan. 22, 2010, in the Korean Intellectual Property Office, the disclosure of which is incorporated by reference herein in its entirety.

BACKGROUND

1. Field of the Invention

The present invention relates to a positive typed photosensitive composition used in a semiconductor manufacturing process.

2. Description of the Related Art

In general, most photosensitive compositions used in a semiconductor manufacturing process may exhibit a positive type, because an exposed portion is dissolved in an alkali aqueous solution by ultraviolet exposure. The composition may include a resin dissolved in the alkali aqueous solution, a photosensitive compound that is insoluble in the alkali aqueous solution and is sensitive to ultraviolet light, and other additives.

As an example of the resin dissolved in the alkali aqueous solution, a polyamide derivative may be given. This resin may be transformed into polyamide and polybenzoxazole by heat, thereby exhibiting characteristics of a heat-resistant resin. In a conventional art, a composition not having photosensitivity may be used, however, in recent years, there arises a tendency to prefer a composition having photosensitivity for the purpose of process simplification.

A photosensitive composition manufactured by using a general polyamide derivative may exhibit a poor thermal stability to adversely affect pattern formation, or exhibit a significant volume reduction, while being subjected to a crosslinking process at a temperature of about 350° C., and thus a separate crosslink agent may need to be used. In this case, due to characteristics of a compound having crosslink characteristics, a resolution of the pattern may be reduced, and a degree of intermolecular crosslinking may be severe during the crosslinking process, and thereby ductility of inherent characteristics of a polyimide resin may be deteriorated. These additives may reduce sensitivity when forming the pattern, and thereby a process time may be lengthened.

In a recent semiconductor manufacturing process, the photosensitive composition may be coated on a wafer to be subjected to a patterning, and heated at a temperature of about 350° C. for one hour so as to perform a crosslinking on a film. When a crosslinking temperature is increased, an adverse influence may be exerted on a semiconductor device.

Accordingly, there is a demand for a composition having high reliability even at a relatively low temperature.

SUMMARY

An aspect of the present invention provides a high sensitive-photosensitive resin composition which is excellent in adhesiveness and a heat resistance.

According to an aspect of the present invention, there is provided a photosensitive resin composition, comprising 0.1 to 20 parts by weight of a polygonal oligomeric silsesquioxane derivative, and 5 to 30 parts by weight of a compound generating acid by light, based on 100 parts by weight of a polyamide derivative.

Additional aspects, features, and/or advantages of the invention will be set forth in part in the description which follows and, in part, will be apparent from the description, or may be learned by practice of the invention.

EFFECT

According to exemplary embodiments, there is provided a photosensitive resin composition that may be readily crosslinked even at a relatively low temperature, may be excellent in adhesiveness to a substrate to thereby reduce a defective proportion in a developing process, and may be excellent in heat resistance to thereby reduce a defective proportion caused due to a heat.

DETAILED DESCRIPTION

Hereinafter, a photosensitive resin composition according to an embodiment will be described in detail.

The photosensitive resin composition may include 0.1 to 20 parts by weight of a polygonal oligomeric silsesquioxane derivative, and 5 to 30 parts by weight of a compound generating acid by light, based on 100 parts by weight of a polyamide derivative.

The polyamide derivative may be generated by reacting polymers such as dicarboxylic acid and bisaminophenol, and these polymers may include an acidic functional group or a derived substituent.

The polyamide derivative may be represented by the following Chemical Formula 1.

[Chemical Formula 1]

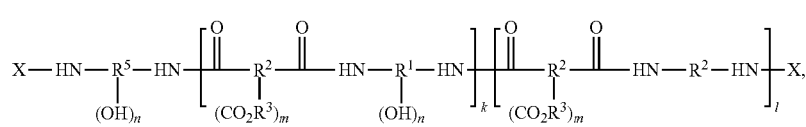

where $R^1$, $R^2$, $R^4$, and $R^5$ independently represent a bivalent to hexavalent aryl group with at least two carbon atoms, $R^3$ represents either a hydrogen atom or an alkyl group with 1 to 10 carbon atoms, k represents an integer of 10 to 1,000, 1 represents an integer of 1 to 1,000, n and m independently represent an integer of 0 to 2 (n+m>0), and X represents either a hydrogen atom or an aryl group with 2 to 30 carbon atoms.

Also, the polyamide derivative may be represented by the following Chemical Formula 2.

[Chemical Formula 2]

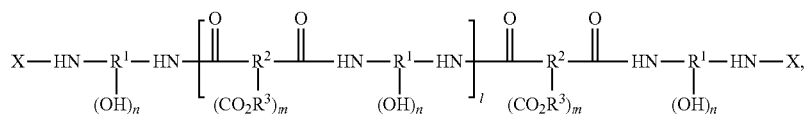

where $R^1$ and $R^2$ independently represent a bivalent to hexavalent aryl group with at least two carbon atoms, $R^3$ represents either a hydrogen atom or an alkyl group with 1 to 10 carbon atoms, l represents an integer of 10 to 1,000, n and m independently represent an integer of 0 to 2 (n+m>0), and X represents either a hydrogen atom or an aryl group with 2 to 30 carbon atoms.

In the above Chemical Formulas 1 and 2, $R^1$ may include compound groups which are represented by the following Chemical Formulas, and the compound groups may be used alone or in combination of two or more of the compound groups.

[Chemical Formulas]

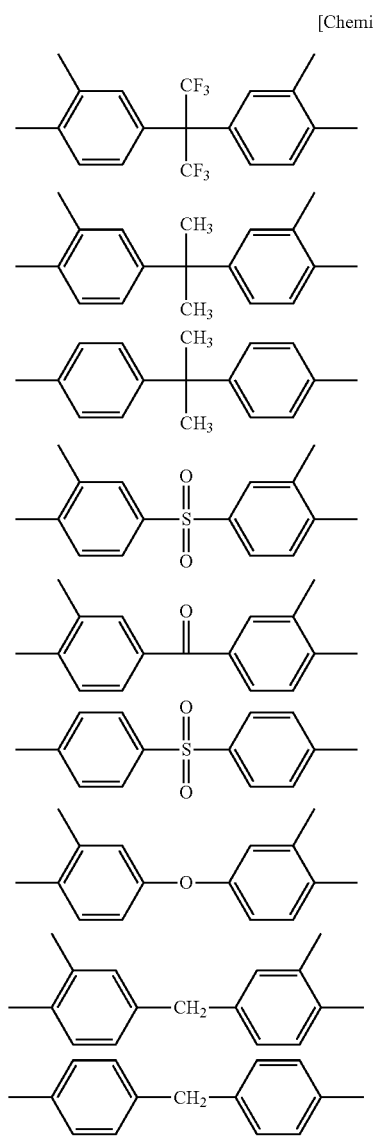

-continued

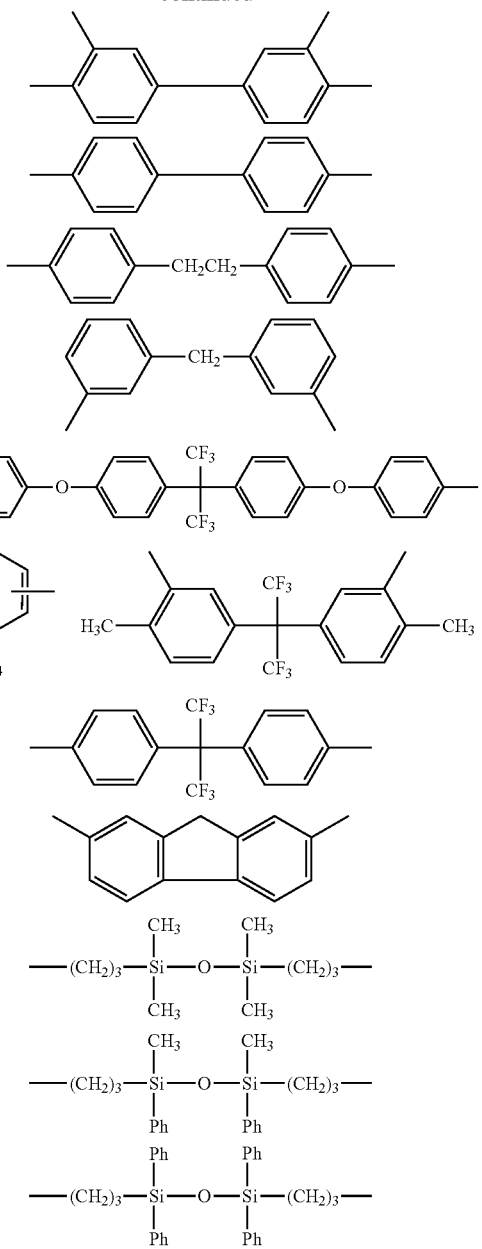

Also, in the above Chemical Formulas 1 and 2, $R^2$ may include compound groups which are represented by the following Chemical Formulas, and the compound groups may be used alone or in combination of two or more of the compound groups.

[Chemical Formulas]

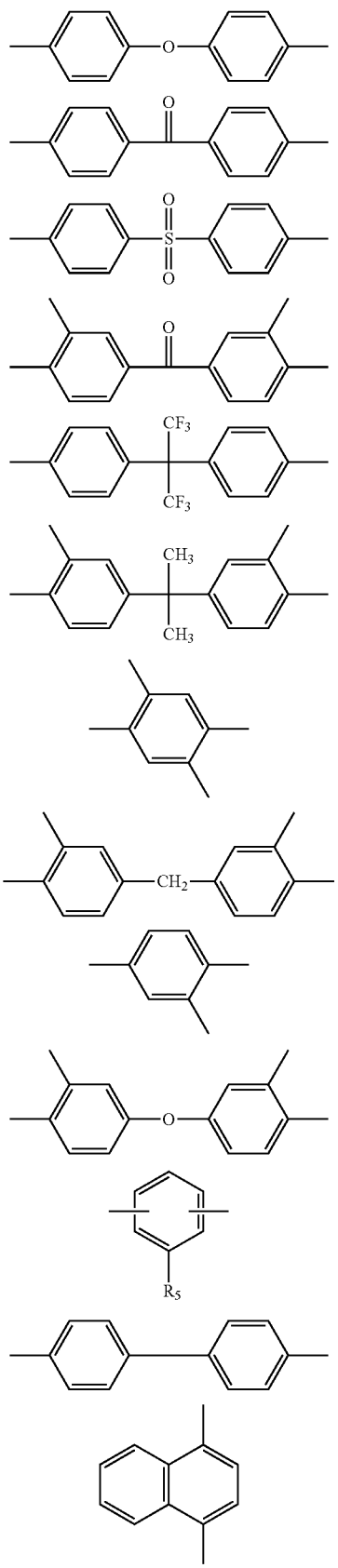

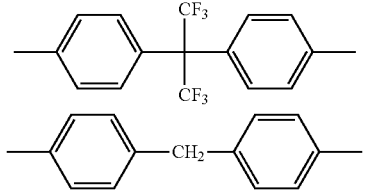

In the above Chemical Formula 1, $R^4$ and $R^5$ may be one of a hydrogen atom, a halogen atom, a hydroxyl group, carboxyl group, a thiol group, an alkyl group with 1 to 10 carbon atoms, and an aryl group with 1 to 10 carbon atoms.

In a polymer synthesis of the above Chemical Formulas 1 or 2, to adjust a molecular weight and to improve storage stability of a product, an amine group of a main chain of a polymer may be replaced with a chemically stable functional group, and the amine group may be preferably replaced with an amide group. For example, as examples of a compound that is reacted with the amine group to generate the amide group, there may be given an alkylcarbonyl chloride derivative, an alkenylcarbonyl chloride derivative, an alkinylcarbonyl chloride derivative, an alkylsolfonyl chloride derivative, an arylsolfonyl chloride derivative, an alkyl group-containing acid anhydride derivative, an aryl group-containing acid anhydride derivative, an alkenyl group-containing acid anhydride derivative, and the like. However, when using the alkylcarbonyl chloride derivative and the alkenylcarbonyl chloride derivative that have a significantly high chemical reaction speed, the alkylcarbonyl chloride derivative and the alkenylcarbonyl chloride derivative may be reacted with another functional group as well as the amine group of the polymer main chain, and thereby by-products may be disadvantageously generated.

In the above Chemical Formulas 1 or 2, X may include a hydrogen atom or compound groups which is represented by the following Chemical Formulas, and the compound groups may be used alone or in combination of two or more of the compound groups.

[Chemical Formulas]

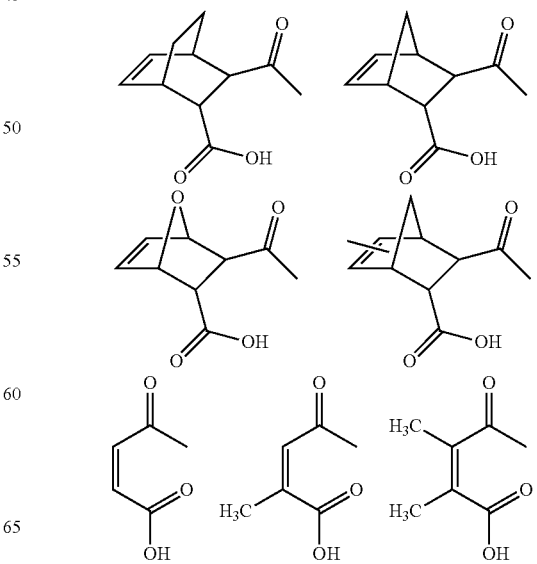

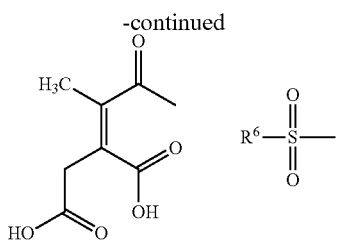

The polyamide derivative represented by the above Chemical Formulas 1 or 2 may be generally manufactured by a condensation reaction. The condensation reaction may be performed such that a dicarboxylic acid derivative is transformed into a dichloride derivative using thionyl, and is subjected to the condensation reaction with a diamine derivative under a basic catalyst. A reaction temperature of the condensation reaction may not be particularly limited, however, and may be preferably about 80° C. or less. When the reaction temperature of the condensation reaction is too high, by-products may be generated to deteriorate a development speed or UV transmittance, and the like. However, when the reaction temperature thereof is −10° C. or less, a reaction speed may be significantly reduced. A reaction mixture of the condensation reaction may be slowly dropped on a pure material to have the reaction mixture precipitated after the condensation reaction is completed, thereby obtaining a polymer compound of a solid particle type. When a molecular weight of the polymer is relatively great, a used amount of an acid anhydride derivative or a sulfonxyl chloride derivative capable of being reacted with an amine functional group is increased, thereby adjusting the molecular weight of the polymer.

By enabling hydroxyl polyamide to be included in the photosensitive resin composition according to an embodiment, an adhesive force between the photosensitive resin composition and an adherend may be improved without a reduction in sensitivity of lithography, and thus a peeling phenomenon generated at the time of developing and adhesiveness may be improved.

The photosensitive resin composition according to an embodiment may include a polygonal oligomeric silsesquioxane derivative other than the polyamide derivative.

The polygonal oligomeric silsesquioxane (POSS) derivative may be represented by the following Chemical Formulas 3 or 4.

  [Chemical Formula 3]

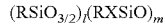  [Chemical Formula 4]

In the above Chemical Formulas 3 or 4, R represents one of a hydrogen atom, a substituted or unsubstituted aliphatic or aromatic single bond with 1 to 30 carbon atoms, and an organic group including one of silicon, oxygen, sulfur, and nitrogen, and n represents an integer of 6 to 14.

In the above Chemical Formula 2, X may represent OR', and R' may represent one of a hydrogen atom, an alkyl group, an aryl group, and a halogen atom.

The polygonal oligomeric silsesquioxane (POSS) derivative of Chemical Formula 3 may have a polygonal cage type, a ladder type, a random type, and the like. In particular, in a case of the polygonal cage type, the polygonal oligomeric silsesquioxane (POSS) derivative may have a characteristic of its uniform frame structure. Due to the uniform frame structure, completely different properties may be exhibited due to the manufacture of a block polymer and structural restrictions of the block polymer.

According to an embodiment, a polygonal oligomeric silsesquioxane compound may be obtained by applying, to a structure of silsesquioxane, functional groups such as alcohol, an amine group, hydrocarbon with 1 to 8 carbon atoms, an epoxy group, a norbornene group, a carboxyl group, a cyano group, and the like, and the polygonal oligomeric silsesquioxane compound may be represented by the following Chemical Formulas, however, embodiments are not limited thereto. The functional groups may be used in a combination of two or more thereof.

[Chemical Formulas]

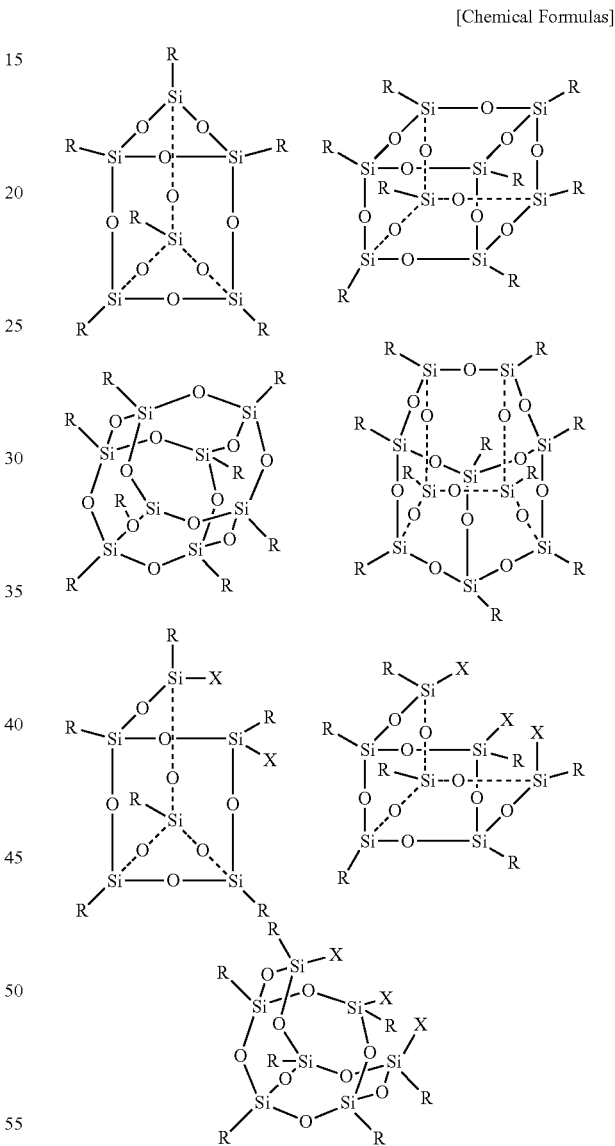

In the immediately above Chemical Formulas, R represents one of a hydrogen atom, a substituted or unsubstituted aliphatic or aromatic single bond with 1 to 30 carbon atoms, and an organic group including one of silicon, oxygen, sulfur, and nitrogen.

The polygonal oligomeric silsesquioxane derivative may include trans cyclohexandiolisobutyl silsesquioxane, 1,2-propanediolisobutyl silsesquioxane, octa(3-hydroxy-3-methylbutyldimethylcyloxy)silsesquioxane, aminopropylisobutyl silsesquioxane, aminopropylisooctyl silsesquioxane, octaminophenyl silsesquioxane, N-phenylaminopropyl silsesquioxane, N-methylaminopropylisobutyl silsesquioxane, octaammonium silsesquioxane, p-aminophenylcyclohexyl silsesquioxane, m-aminophenylisobutyl silsesquioxane, amic acidcyclohexyl silsesquioxane, octaamic acid silsesquioxane, epoxycyclohexylisobutyl silsesquioxane, glycidylethyl silsesquioxane, glycidylisobutyl silsesquioxane, triglycidylisobutyl silsesquioxane, glycidylphenyl silsesquioxane, trifluoropropyl silsesquioxane, trifluoropropylisobutyl silsesquioxane, maleimidecyclohexyl silsesquioxane, maleimideisobutyl silsesquioxane, acryloisobutyl silsesquioxane, metacryloisobutyl silsesquioxane, metaacrylateisobutyl silsesquioxane, dodecaphenyl silsesquioxane, phenylisobutyl silsesquioxane, octatrimethyl-cyloxy silsesquioxane, cyanopropylisobutyl silsesquioxane, norbornenylethylethyl silsesquioxane, norbornenylethyldisilanoisobutyl silsesquioxane, norbornenylisobutyl silsesquioxane, vinyl isobutyl silsesquioxane, octavinyl silsesquioxane, octasilane silsesquioxane, trisilanolcyclohexyl silsesquioxane, disilanolisobutyl silsesquioxane, tetrasilanolphenyl silsesquioxane, and mercaptopropyliso silsesquioxane.

In the photosensitive resin composition according to an embodiment, a heat resistance of an insulating layer may be improved due to a high glass transition temperature (Tg) of silsesquioxane after the photosensitive resin composition is hardened.

The photosensitive resin composition may contain 0.1 to 20 parts, preferably 0.5 to 10 parts, by weight of the polygonal oligomeric silsesquioxane derivative based on 100 parts by weight of the polyamide derivative. When the polygonal oligomeric silsesquioxane derivative is less than 0.1 parts by weight, a property improvement effect may be insignificant, and when the polygonal oligomeric silsesquioxane derivative exceeds 20 parts by weight, a tensile elongation of a film may be reduced after the photosensitive resin composition is hardened.

The photosensitive resin composition according to an embodiment may include the compound generating acid by light other than the polyamide derivative and the polygonal oligomeric silsesquioxane derivative.

As an example of the compound generating acid by light, a diazonaphthol compound may be used. The diazonaphthol compound may be obtained by reacting a phenol derivative including at least two hydroxy groups and a diazonaphtholsulfonyl chloride derivative under an amine catalyst.

The diazonaphthol compound as the photosensitive compound may be represented by the following Chemical Formula 5.

[Chemical Formula 5]

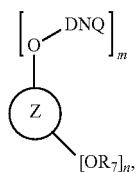

where n and m independently represent an integer of 0 to 5 (n+m>0), Z represents an aryl group with 12 to 40 carbon atoms, DNQ represents the following Chemical Formula 6, and $R_7$ represents one of a hydrogen atom, an alkyl group with 1 to 12 carbon atoms, and an alkylcarbonyl group with 1 to 12 carbon atoms.

[Chemical Formula 6]

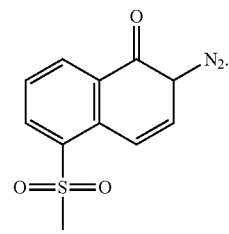

In the above Chemical Formula 6, a ratio of DNQ to $R_7$ may be 1:4 to 20:1. When the ratio of the DNQ to $R_7$ is too high, a sensitivity may be reduced, and when the ratio thereof is too low, a perpendicularity of a pattern may be deteriorated. When using an i-line exposurer, a phenol derivative having no ultraviolet absorbance at 365 nm may be preferably used. When the ultraviolet absorbance is relatively high, the perpendicularity of the pattern may be deteriorated. Examples of the diazonaphthol compound may be represented by the following Chemical Formulas, however, the present invention is not limited thereto.

[Chemical Formulas]

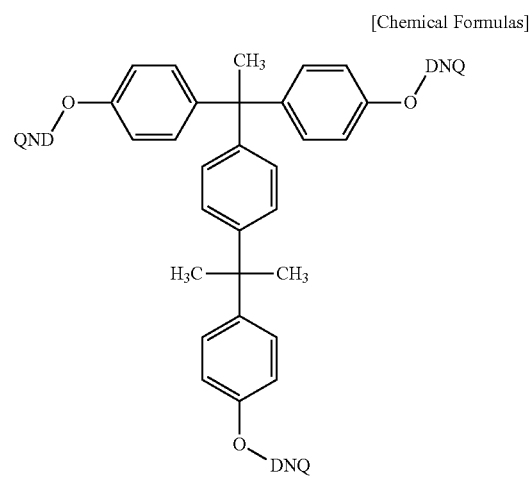

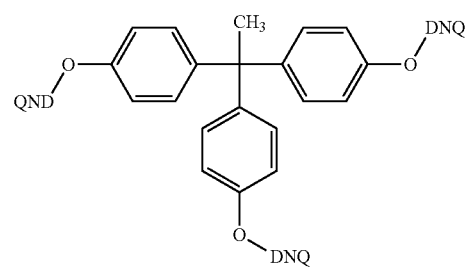

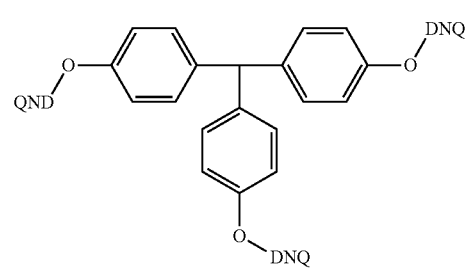

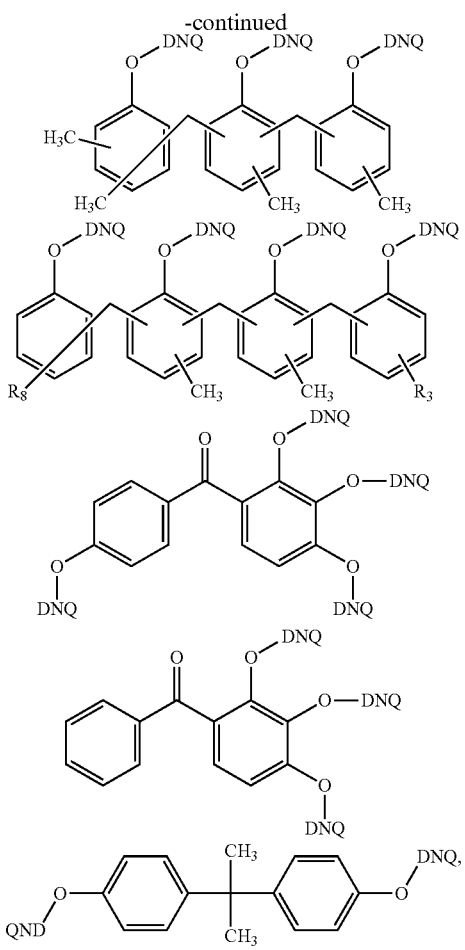

where DNQ represents a compound group being one of a hydrogen atom, an alkylcarbonyl group, and a compound group represented by Chemical Formula 6. $R_8$ represents a methyl group or a naphthoquinonediazide sulfoxy group (—O-DNQ).

The diazonaphthol compound may be used in a mixture of two or more of the diazonaphthol compound. A benzophenone derivative may be preferably used in terms of sensitivity, however, may be unfavorably used in terms of the perpendicularity of the pattern. However, when a small amount of the benzophenone derivative is used, the sensitivity may be slightly improved instead of deteriorating the perpendicularity. In general, in terms of a UV sensitivity, a 1,2-naphthoquinone-2-diazide-4-sulfonic acid ester derivative may be preferably used rather than a 1,2-naphthoquinone-2-diazide-5-sulfonic acid ester derivative. The diazonaphthol compound may be preferably used in an amount of 5 to 30 parts by weight based on 100 parts by weight of the polyamide compound. When an amount of the diazonaphthol compound is less than 5 parts by weight, a dissolution suppressing effect is insignificant causing a difficulty in pattern formation, and when the amount of the diazonaphthol compound exceeds 30 parts by weight, a film thickness loss is significantly increased after a thermal crosslinking is performed.

The photosensitive resin composition according to an embodiment may further include at least one additive selected from a group consisting of anti-corrosion preparations, a surfactant, and an antifoaming agent.

To obtain a composition having a high resolution and a high sensitivity without reducing other properties, and having a minimal change in its thickness, the additive may be used. The additive may include a low-molecular phenol compound. The low-molecular phenol compound may be easily acquired, however, may have a poor thermal stability, so that a pattern formed when a heat-crosslinking is performed at a high temperature of 300° C. or more may not be maintained. To overcome this, a phenol derivative including a methylol functional group or a separate heat-crosslinking agent may be used. When the heat-crosslinking agent is separately used, the thermal stability may be maintained, however, flexibility of a film where the crosslinking is performed may be deteriorated.

As the additive, a silane coupling agent may be used in order to achieve an adhesive force with a substrate, or a diaminosiloxane monomer of less than 5% may be used in a polymer main chain. When the diaminosiloxane monomer of the polymer main chain of 5% or more is used, a heat resistance may be deteriorated. As examples of the silane coupling agent, there may be given vinyl trimethoxy silane, {3-(2-aminoethylamino)propyl} trimethoxy silane, 3-aminopropyltrimethoxy silane, N-methylaminopropyltrimethoxy silane, 3-glycidoxy-propyltrimethoxy silane, 3-glycidoxy-propyltriethoxy silane, 2-(3,4-epoxycyclohexyl)ethyltrimethoxy silane, 3-methacryloxypropyltrimethoxy silane, 3-mercaptopropyltrimethoxy silane, N-(1,3-dimethylbutylidene)-3-(triethoxysilane)-1-propanamine, N,N-bis (3-trimethoxysilyl) propylethylamine, N-(3-trimethoxysilylpropyl)pyrrole, ureidopropyltrimethoxy silane, (3-triethoxysilylpropyl)-t-butyl-carbamate, N-phenylaminopropyltrimethoxysilane, and 3-isocyanatepropyltrimethoxysilane. Of these, 3-glycidoxy-propyltrimethoxy silane and 3-glycidoxy-propyltriethoxy silane, ureidopropyltrimethoxy silane may be superior. A used amount of a silane coupling agent may preferably be in an amount of 0.5 to 10 parts by weight based on 100 parts by weight of the polyamide compound. When the used amount of the silane coupling agent is less than 0.5 parts by weight, an adverse influence may be exerted on improvement of the adhesive force, and when the used amount thereof is greater than 10 parts by weight, pattern formation may be suppressed, or scum may be generated.

An etching process may be performed to remove a lower passivation layer after patterning using the photosensitive resin composition according to the present invention. In this instance, to prevent corrosion of an exposed aluminum layer or a conductive wiring layer, an anti-corrosion agent may be added. As a representative example of the anti-corrosion agent, there may be given a catechol derivative, a pyrogallol derivative, an alkyl gallate derivative, and the like in which a hydroxyl group is adjacent to a phenyl group. For example, the present invention is not particularly limited thereto as long as derivatives of catechol, alkyl catechol, alkoxy catechol, pyrogallol, alkyl pyrogallol, alkoxy pyrogallol, alkyl gallate, and the like in which the hydroxyl group is adjacent to the phenyl group. The anti-corrosion agent may preferably be used in an amount of 0.01 to 10% based on the whole composition. When a used amount of the anti-corrosion agent is less than 0.01%, an anti-corrosion function may be deteriorated, and when the used amount thereof is more than 10%, an amount of loss of the film may be significantly increased when developing.

In addition, a surfactant may be used to improve coating physical properties, and an antifoaming agent may be used to remove foam.

In manufacturing the photosensitive resin composition according to the present invention, γ-butyrolactone, N-methylpyrrolidone, N,N-dimethylacetamide, dimethylsulphoxide, cyclohexan, 2-heptanone, propyleneglycolmonomethyletheracetate, methyl isobutyl keton, ethylenglycoldimethylether, ethylenglycoldiethylether, ethyllactate, and the like may be used as a solvent, however, the present invention is not limited thereto. These solvent may be used alone or in a mixture of two or more of the solvents.

Hereinafter, a method for forming a pattern using the photosensitive resin composition according to an embodiment will be described in detail. The photosensitive resin composition may be uniformly dissolved in the solvent to be filtered, and coated on a silicon wafer or a glass substrate, using a rotation-coating, a spray coating, a roll coating, and the like to have a desired thickness of a film. The coated substrate may be heated to 50° C. to 150° C. using one of an oven, a hot plate, and infrared rays, so that the solvent may be dried and removed. An exposing process may be performed on a film of the composition generated on the substrate, using one of an i-line, a h-line, a g-line exposure. After developing the substrate where a mask pattern is printed, the substrate may be cleansed and dried to obtain a pattern. As a developer used in the developing process, tetramethylamnonium hydroxide may be used, however, the present invention is not limited thereto as long as a compound having the same basic characteristics is used as the developer. To transform the obtained pattern to a polyimide compound or a polybenzoxazole compound, the obtained pattern may be inserted in an oven of at least 280° C., and then heated for several tens of minutes.

The obtained film may be used as an interinsulation layer in a semiconductor or display process, or used as an intermediate protective layer in a packaging process. According to an embodiment, the photosensitive resin composition may have a high sensitivity, have excellent resolution and excellent coating uniformity when the substrate is developed after the photosensitive resin composition is coated on the substrate, and have improved adhesive force and heat resistance. A semiconductor device manufactured according to an embodiment may include a pattern layer having the pattern formed in the above described manner.

Hereinafter, the present invention will be described in detail by examples. It is to be understood, however, that these examples are for illustrative purpose only, and are not construed to limit the scope of the present invention. In this instance, an organic solvent having been subjected to a dehydration process may be used, and a synthesis of a polymer may be performed under a nitrogen atmosphere.

SYNTHESIS EXAMPLE 1

4,4-oxybisbenzoyl Chloride Synthesis

In a 0.5 L flask including an agitator and a thermometer mounted therein, 60 g (0.232 mol) of 4,4-oxybisbenzoic acid was added in 240 g of N-methylpyrrolidone (NMP), and agitated and dissolved. Next, the flask was cooled down to 0° C., and 110 g (0.9246 mol) of thionyl chloride was dropped in the flask to have a dropped product reacted for one hour, thereby obtaining a 4,4-oxybisbenzoyl chloride solution.

[Polyamide A Synthesis]

400 g of NMP was put in a 1 L flask including an agitator and a thermometer mounted therein, 85 g (0.2321 mol) of 2,2-bis(3-amino-4-hydroxyphenyl) hexafluoropropane was added in the flask, and agitated and dissolved. Next, 39 g (0.4930 mol) of pyridine was added in the flask, and 8 g (0.0487 mol) of 5-norbonen-2,3-dicarboxylic acid anhydride and the synthesized 4,4-oxybisbenzoyl chloride were slowly dropped in the flask. Next, a dropped product was agitated at room temperature for one hour. Next, a solution obtained through the above described process was added in three liters of water to obtain a precipitate. Next, the obtained precipitate was filtered, washed, and vacuum-dried to obtain 128 g of a polyamide A. In this instance, the obtained polyamide had a weight-average molecular weight in terms of polystyrene of 18,500.

Dimethyl-3,3',4,4'-diphenyl ether-tetracarboxylate Dichloride Synthesis 60 g (0.1934 mol) of dimethyl-3,3',4,4'-diphenyl ether-tetracarboxylic acid anhydride, 12.5 g (0.3901 mol) of methyl alcohol, 2 g (0.0198 mol) of triethylamine, and 120 g of NMP were added in a 1 L flask including an agitator and a thermometer mounted therein, and were agitated and reacted at room temperature for four hours to obtain a di-n-methyl-3,3', 4,4'-diphenyl ether-tetracarboxylate solution. Next, the flask was cooled down to about 0° C., 70 g (0.5884 mol) of thionyl chloride was dropped to have a dropped product reacted for two hours, thereby obtaining a dimethyl-3,3',4,4'-diphenyl ether-tetracarboxylate dichloride solution.

SYNTHESIS EXAMPLE 2

Polyamidate B Synthesis 260 g of NMP was put in a 1 L flask including an agitator and a thermometer mounted therein, 65 g (0.1775 mol) of 2,2-bis(3-amino-4-hydroxyphenyl) hexafluoropropane was added, and these reactants were agitated to be dissolved. Next, 35 g (0.4425 mol) of pyridine was added, and the dimethyl-3,3',4,4'-diphenyl ether-tetracarboxylate dichloride solution was slowly dropped for 30 minutes, and these reactants were agitated for one hour at room temperature. Three liters of water was added to a solution obtained through the above described process to obtain a precipitate. Next, the obtained precipitate was filtered, washed, and vacuum-dried to obtain 128 g of a polyamidate B. In this instance, the polyamidate had a weight-average molecular weight in terms of polystyrene of 19,200.

An analysis device and its measurement conditions thereof are described as below.

Molecular weight measurement (Gel permeation Chromatography; GPC)
Solution: DMAc
Flow rate: 1 mL/min
Column temperature: 40° C.
Column: polymer Laboratories PLgel
Calibration curve: polystyrene equivalent
Dectector: Refractive Index (RI)

EXAMPLE

Photosensitive Resin Film Manufacture

Oligomeric silsesquioxane (C) and a compound (D) generating acid by light were contained in respective amounts, as shown in Table 1 below, based on 100 parts by weight of each of the polyamide A and the polyamidate B obtained from the above described Synthesis Examples 1 and 2, and were dissolved in γ-butyrolactone, acting as a solvent, to be 40 wt. %, Next, particulate foreign substances were removed using a filter of 0.5 μm. The obtained filtrate was rotation-coated on a silicon wafer of eight inches to have a thickness of 10 μm. In this instance, to completely remove the solvent, a baking was performed on the wafer at about 130° C. for 60 seconds. The coated wafer was exposed using an exposure, and developed using tetramethylammonium hydroxide 2.38 wt %.

The oligomeric silsesquioxane (C) may be as below.

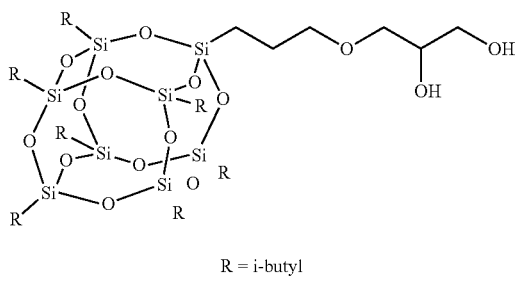

R = i-butyl

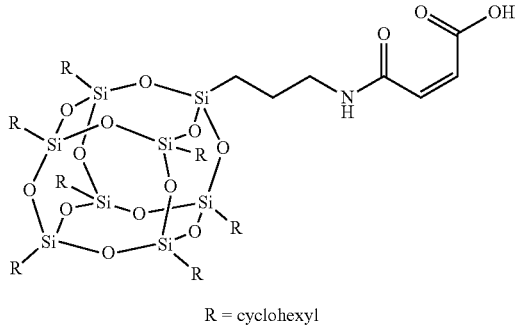

R = cyclohexyl

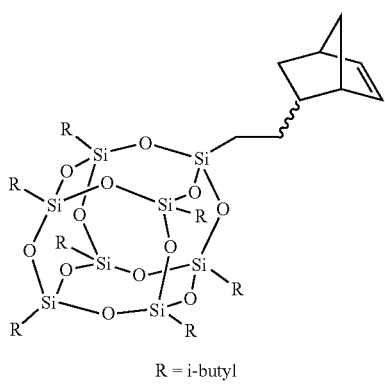

R = i-butyl

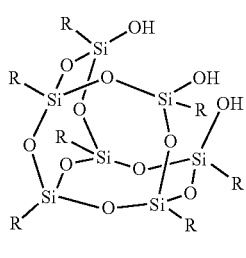

R = phenyl

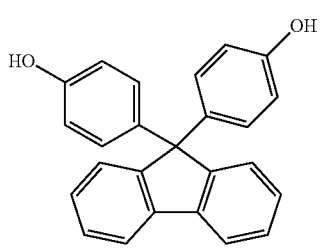

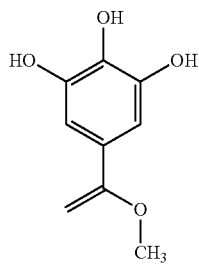

As the compound (D) generating acid by light, the following compound may be used.

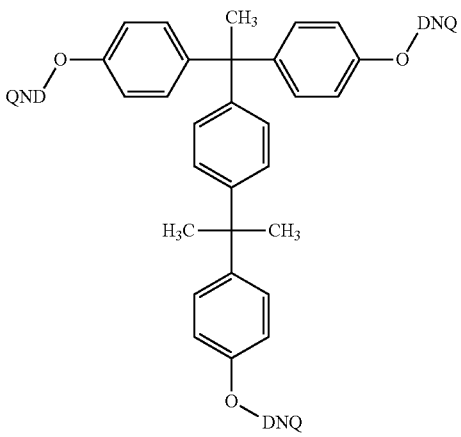

TABLE 1

| | Polymer | Component C | Component D |
|---|---|---|---|
| Example 1 | A (34 g) | — | 6 g |
| Example 2 | A (34 g) | C 1 (2 g) | 6 g |
| Example 3 | A (34 g) | C 2 (2 g) | 6 g |
| Example 4 | A (34 g) | C 3 (2 g) | 6 g |
| Example 5 | A (34 g) | C 4 (2 g) | 6 g |
| Example 6 | A (34 g) | C 5 (2 g) | 6 g |
| Example 7 | A (34 g) | C 6 (2 g) | 6 g |
| Example 8 | B (34 g) | C 1 (2 g) | 6 g |
| Example 9 | B (34 g) | C 2 (2 g) | 6 g |
| Example 10 | B (34 g) | C 3 (2 g) | 6 g |
| Example 11 | B (34 g) | C 4 (2 g) | 6 g |
| Example 12 | B (34 g) | C 5 (2 g) | 6 g |
| Example 13 | B (34 g) | C 6 (2 g) | 6 g |

Pattern Type Verification

A pattern type after developing was classified into good, fair, and poor based on pattern perpendicularity, mask-shaped solid, and the like in a Scanning Electron Microscope (SEM).

Heat-Resistance Estimation

A glass transition temperature (Tg) of a hardened film and a temperature of a reduction of 5 wt. % of the hardened film were estimated after peeling, cleaning, and drying the hardened film using hydrofluoric acid.

Glass Transition Temperature (Tg) Estimation
Device name: EXSTAR 6000 (Seiko Epson)
Sample size: 10 mm (0.01 mm$^2$)
Initial weight: 1.5 g
Heating temperature: 10° C./min
5 wt. % Reduction-Temperature Measurement
Device name: DSC 200F3 (Netzsch)
Sample amount: 5 mg
Nitrogen: 50 mL/min
Heating temperature: 10° C./min Adhesive Force Measurement The photosensitive resin composition was coated on a silicon wafer, so that a thickness of a film is 10 μm, and a preliminary firing was performed at about 130° C. for 60 seconds. The obtained film was inserted in an oven under a nitrogen atmosphere, and was sintered at about 350° C. for 30 minutes, thereby obtaining a polybenzoxazole film. Next, a grid patterned cut with 10 rows and 10 columns was made on the obtained sample, at intervals of 2 mm, and a highly accelerated test was performed under at 121° C., 2 atmosphere, for 400 hours in a Pressure Cooker Test (PCT). Next, after the highly accelerated test, a number of layers of the film separated from a substrate was verified using a cellophane adhesive tape to estimate an adhesive force.

Estimation results of Examples 1 to 13 below were shown in Table 2 below.

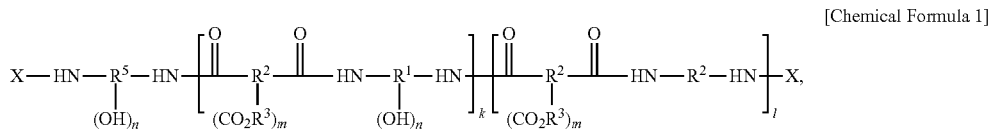

[Chemical Formula 1]

TABLE 2

| | Sensitivity (mJ/cm²) | Pattern type | Tg (° C.) | 5 wt. % reduction temperature | Adhesive force |
|---|---|---|---|---|---|
| Example 1 | 320 | Good | 320 | 493 | 10 |
| Example 2 | 300 | Good | 344 | 508 | 2 |
| Example 3 | 240 | Good | 346 | 507 | 0 |
| Example 4 | 320 | Best | 362 | 511 | 1 |
| Example 5 | 240 | Best | 352 | 510 | 0 |
| Example 6 | 260 | Good | 304 | 506 | 10 |
| Example 7 | 260 | Fair | 288 | 497 | 9 |
| Example 8 | 280 | Good | 335 | 498 | 0 |
| Example 9 | 220 | Good | 338 | 496 | 1 |
| Example 10 | 320 | Good | 350 | 503 | 2 |
| Example 11 | 220 | Good | 339 | 504 | 1 |
| Example 12 | 240 | Fair | 284 | 494 | 8 |
| Example 13 | 240 | Fair | 277 | 491 | 11 |

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A photosensitive resin composition comprising 0.1 to 20 parts by weight of a polygonal oligomeric silsesquioxane derivative, and 5 to 30 parts by weight of a compound generating acid by light, based on 100 parts by weight of a polyamide derivative.

2. The photosensitive resin composition of claim 1, wherein the polyamide derivative is a compound being represented by

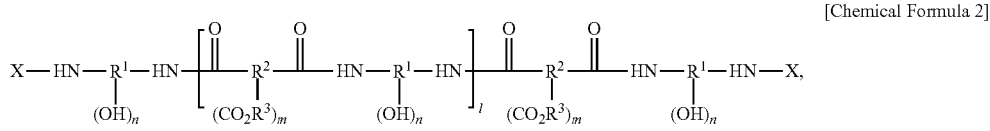

[Chemical Formula 2]

where $R^1$, $R^2$, $R^4$, and $R^5$ independently represent a bivalent to hexavalent aryl group with at least two carbon atoms, $R^3$ represents either a hydrogen atom or an alkyl group with 1 to 10 carbon atoms, k represents an integer of 10 to 1,000, l represents an integer of 1 to 1,000, n and m independently represent an integer of 0 to 2 (n+m>0), and X represents either a hydrogen atom or an aryl group with 2 to 30 carbon atoms.

3. The photosensitive resin composition of claim 1, wherein the polyamide derivative is a compound being represented by where $R^1$ and $R^2$ independently represent a bivalent to hexavalent aryl group with at least two carbon atoms, $R^3$ represents either a hydrogen atom or an alkyl group with 1 to 10 carbon atoms, l represents an integer of 10 to 1,000, n and m independently represent an integer of 0 to 2 (n+m>0), and X represents either a hydrogen atom or an aryl group with 2 to 30 carbon atoms.

4. The photosensitive resin composition of claim 1, wherein the polygonal oligomeric silsesquioxane derivative is represented by

[Chemical Formula 3]

where R represents one of a hydrogen atom, a substituted or unsubstituted aliphatic or aromatic single bond with 1 to 30 carbon atoms, and an organic group including one of silicon, oxygen, sulfur, and nitrogen, and n represents an integer of 6 to 14.

5. The photosensitive resin composition of claim 1, wherein the polygonal oligomeric silsesquioxane derivate is represented by

[Chemical Formula 4]

where R represents one of a hydrogen atom, a substituted or unsubstituted aliphatic or aromatic single bond with 1 to 30 carbon atoms, and an organic group including one of silicon, oxygen, sulfur, and nitrogen, X represents OR', R' representing one of a hydrogen atom, an alkyl group, an aryl group, and a halogen atom, l represents an integer of 4 to 15, and k represents an integer of 1 to 5.

6. The photosensitive resin composition of claim 1, wherein the compound generating acid by light includes diazonaphthol.

7. The photosensitive resin composition of claim 1, further comprising:
  at least one additive selected from a group consisting of anti-corrosion preparations, a surfactant, and an anti-foaming agent.

8. A pattern forming method, comprising:
  applying a photosensitive resin composition on a substrate, the photosensitive resin composition comprising about 0.1 to 20 parts by weight of a polygonal oligomeric silsesquioxane derivate, and about 5 to 30 parts by weight of a compound generating acid by light, based on 100 parts by weight of a polyamide derivate;
  drying the substrate where the photosensitive resin composition is applied;
  exposing the dried substrate;
  developing the exposed substrate; and
  heat-treating the developed substrate.

9. A semiconductor device including a pattern layer formed in a pattern forming method, the pattern forming method comprising:
  applying a photosensitive resin composition on a substrate, the photosensitive resin composition comprising about 0.1 to 20 parts by weight of a polygonal oligomeric silsesquioxane derivate, and about 5 to 30 parts by weight of a compound generating acid by light, based on 100 parts by weight of a polyamide derivate;
  drying the substrate where the photosensitive resin composition is applied;
  exposing the dried substrate;
  developing the exposed substrate; and
  heat-treating the developed substrate.

* * * * *